United States Patent
Shirahama et al.

(10) Patent No.: US 6,900,628 B2
(45) Date of Patent: May 31, 2005

(54) SEMICONDUCTOR INTEGRATED CIRCUIT ALLOWING PROPER DETECTION OF PIN CONTACT FAILURE

(75) Inventors: Hidenori Shirahama, Hyogo (JP); Masaaki Mihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 3 days.

(21) Appl. No.: 10/136,398

(22) Filed: May 2, 2002

(65) Prior Publication Data

US 2003/0042888 A1 Mar. 6, 2003

(30) Foreign Application Priority Data

Aug. 28, 2001 (JP) ......................................... 2001-257493

(51) Int. Cl.[7] ............................................. G01R 31/02
(52) U.S. Cl. ................................... 324/158.1; 324/763
(58) Field of Search ............................... 324/763, 765, 324/768, 769, 158.1; 714/733, 734

(56) References Cited

U.S. PATENT DOCUMENTS

| | | | | |
|---|---|---|---|---|
| 4,346,309 A | * | 8/1982 | Garrett et al. | 327/377 |
| 5,514,976 A | * | 5/1996 | Ohmura | 324/765 |
| 6,292,342 B1 | * | 9/2001 | Miyamoto | 361/86 |

FOREIGN PATENT DOCUMENTS

| | | |
|---|---|---|
| JP | 6-331705 | 12/1994 |
| JP | 2001-13215 | 1/2001 |
| KR | 1999-002518 | 1/1999 |

* cited by examiner

Primary Examiner—Michael Tokar
Assistant Examiner—Tung X. Nguyen
(74) Attorney, Agent, or Firm—McDermott Will & Emery LLP

(57) ABSTRACT

In a pin contact test, a voltage across an external pin is measured by setting a voltage to be supplied to the power supply nodes in input protection circuits in their respective chips at a prescribed amount by means of voltage control circuits and by supplying a prescribed constant current to external pin. Based on the measurement results, a pin contact failure in chips can be detected.

20 Claims, 11 Drawing Sheets

FIG.2

| | APPLIED VOLTAGE | | | | MEASURED VALUE | | | |
|---|---|---|---|---|---|---|---|---|
| | Na | Na# | Nb | Nb# | CASE A0 | CASE A1 | CASE A2 | CASE A3 |
| TEST1 | 3V | 0V | 3V | 3V | 2V | -1V | 2V | -1V OR BELOW |
| TEST2 | 3V | 3V | 3V | 0V | 2V | 2V | -1V | -1V OR BELOW |
| DETERMINATION | CHIP CA | | | | ○ | ○ | × | × |
| | CHIP CB | | | | ○ | × | ○ | × |

FIG.3

| | APPLIED VOLTAGE | | | | MEASURED VALUE | | | |
|---|---|---|---|---|---|---|---|---|
| | Na | Na# | Nb | Nb# | CASE B0 | CASE B1 | CASE B2 | CASE B3 |
| TEST3 | 3V | 0V | 0V | 0V | 1V | 4V | 1V | 4V OR ABOVE |
| TEST4 | 0V | 0V | 3V | 0V | 1V | 1V | 4V | 4V OR ABOVE |
| DETERMINATION | CHIP CA | | | | ○ | ○ | × | × |
| | CHIP CB | | | | ○ | × | ○ | × |

FIG.5

| | TESTA | TESTB | MEASURED VALUE | | | |
|---|---|---|---|---|---|---|
| NORMAL MODE | 3V | 3V | CASE C0 | CASE C1 | CASE C2 | CASE C3 |
| TEST5 | 0V | 3V | −1V | −1V OR BELOW | −1V | −1V OR BELOW |
| TEST6 | 3V | 0V | −1V | −1V | −1V OR BELOW | −1V OR BELOW |
| DETERMINATION | CHIP CA | | ○ | ○ | × | × |
| | CHIP CB | | ○ | × | ○ | × |

FIG.7

|  | TESTA# | TESTB# | MEASURED VALUE ||||
|---|---|---|---|---|---|---|
|  |  |  | CASE D0 | CASE D1 | CASE D2 | CASE D3 |
| NORMAL MODE | 0V | 0V |  |  |  |  |
| TEST7 | 3V | 0V | 4V | 4V OR ABOVE | 4V | 4V OR ABOVE |
| TEST8 | 0V | 3V | 4V | 4V | 4V OR ABOVE | 4V OR ABOVE |
| DETERMINATION | CHIP CA || ○ | ○ | × | × |
|  | CHIP CB || ○ | × | ○ | × |

SEMICONDUCTOR INTEGRATED CIRCUIT ALLOWING PROPER DETECTION OF PIN CONTACT FAILURE

BACKGROUND OF THE INVENTION

1. Field of the Invention

The present invention relates to a semiconductor integrated circuit, and more particularly to a pin contact test for a semiconductor integrated circuit in which a plurality of chips are packaged in the same package.

2. Description of the Background Art

With the advent of the multimedia age, equipment systems are enlarged in scale but at the same time strongly required to be reduced in size and weight. Since a high integration only through a miniaturized process of LSI (Large Scale Integrated Circuit) is limited, a high density packaging technique such as a multi chip package is generally used in recent years.

FIG. 12 is a schematic illustration of a multi chip package. Two chips CA and CB will be described with reference to FIG. 12 as well as in the following.

In this multi chip package, the upper chip CA and the lower chip CB are respectively arranged above and below. Each of chips CA and CB has a plurality of pads PAD, and in each of chips CA and CB, pads PAD are connected to their respective external pins PIN by wire bonding. This structure as a whole is then sealed with a molding compound such as epoxy resin. In this way, in a multi chip package, an external pin PIN is generally shared among multiple chips.

In the semiconductor integrated circuit in multi chip package as described above, however, it is extremely difficult to conduct a pin contact test.

In FIG. 12, for example, an attention will be paid to an external pin PIN0 and it is assumed that a wire W0 connecting a pad PAD0 on chip CA to external pin PIN0 is disconnected while a wire W0# connecting a pad on chip CB to external pin PIN0 is normal. When a conduction test for detecting a contact failure is performed using external pin PIN0, it is difficult to detect this failure in spite of the failure on the side of chip CA because chip CB is normally operated. Furthermore, even if a failure is detected, it is difficult to specify which chip is defective.

SUMMARY OF THE INVENTION

The present invention relates to a pin contact test. An object of the present invention is to provide a semiconductor integrated circuit allowing proper detection of a pin contact failure.

A semiconductor integrated circuit according to the present invention includes a first chip including a first input pad capable of communicating an electrical signal. The first chip includes: a first power supply node for receiving a supply of a first voltage in a normal operation; a second power supply node for receiving a supply of a second voltage which is lower than the first voltage in the normal operation; a first protection circuit forming a current path between the first input pad and the first power supply node when the voltage of the first input pad is higher than that of the first power supply node by at least a prescribed amount while forming a current path between the first input pad and the second power supply node when the voltage of the first input pad is lower than that of the second power supply node by at least a prescribed amount; and a first test supply voltage control portion for setting the voltages of the first and second power supply nodes at the time of a test. The semiconductor integrated circuit further includes a second chip including a second input pad capable of communicating an electrical signal. The second chip includes: a third power supply node for receiving a supply of the first voltage in the normal operation; a fourth power supply node for receiving a supply of the second voltage in the normal operation; a second protection circuit forming a current path between the second input pad and the third power supply node when the voltage of the second input pad is higher than that of the third power supply node by at least a prescribed amount while forming a current path between the second input pad and the fourth power supply node when the voltage of the second input pad is lower than that of the fourth power supply node by at least a prescribed amount; and a second test supply voltage control portion for setting the voltages of the third and fourth power supply nodes at the time of the test. The semiconductor integrated circuit further includes an external pin terminal for an electrical contact with the first and second input pads. The external pin terminal receives an input of a prescribed current for testing the contact with the first and second input pads.

In the semiconductor integrated circuit in accordance with the present invention, a pin contact test between the first and second input pads and the external terminal can be performed by varying the voltages to be supplied to the first to fourth power supply nodes using the first and second test supply voltage control circuits, and by inputting a prescribed current from the external pin terminal.

Preferably, the first protection circuit includes a first rectifying element electrically coupled between the first input pad and the first power supply node in a forward direction from the first input pad to the first power supply node, and a second rectifying element electrically coupled between the first input pad and the second power supply node in a forward direction from the second power supply node toward the first input pad. The second protection circuit includes a third rectifying element electrically coupled between the second input pad and the third power supply node in a forward direction from the second input pad toward the third power supply node, and a fourth rectifying element electrically coupled between the second input pad and the fourth power supply node in a forward direction from the second power supply node toward the second input pad.

In the semiconductor integrated circuit in accordance with the present invention, since the first and second protection circuits are configured with the first to fourth rectifying elements for testing, there is no need for separately preparing a test circuit, resulting in reduction in the number of components.

Preferably, the test includes a first subtest and a second subtest. In the first subtest, the first test supply voltage control portion supplies the first voltage to each of the first and second power supply nodes, and the second test supply voltage control portion supplies the first and second voltages to the third and fourth power supply nodes, respectively. In the second subtest, the first test supply voltage control portion supplies the first and second voltages to the first and second power supply nodes, respectively, and the second test supply voltage control portion supplies the first voltage to each of the third and fourth power supply nodes.

Preferably, the test includes a first subtest and a second subtest. In the first subtest, the first test supply voltage control portion supplies the second voltage to each of the first and second power supply nodes, and the second test supply voltage control portion supplies the first and second voltages to the third and fourth power supply nodes, respectively. In the second subtest, the first test supply voltage control portion supplies the first and second voltages to the first and second power supply nodes, respectively, and the second test supply voltage control portion supplies the second voltage to each of the third and fourth power supply nodes.

In the semiconductor integrated circuit in accordance with the present invention, the contact between the external pin terminal and the first and second input pads can be tested by setting the voltages to be supplied to the first and second or the third and fourth power supply nodes, at the same value, at the time of the test.

Preferably, the first test supply voltage control portion has a first switch electrically coupling the second power supply node to the second voltage in response to a first electrical signal, and the second test supply voltage control portion has a second switch electrically coupling the fourth power supply node to the second voltage in response to a second electrical signal.

In the semiconductor integrated circuit in accordance with the present invention, since the first and second test supply voltage control circuits are provided with their respective switch circuits and a pin contact test can be performed with the switches turned on and off, the circuit can simply be configured.

In particular, the first switch is a first MOS transistor electrically isolating the second power supply node from the second voltage in response to a first test signal, and the second switch is a second MOS transistor electrically isolating the fourth power supply node from the second voltage in response to a second test signal.

In the semiconductor integrated circuit in accordance with the present invention, since the switch circuits can be configured with MOS transistors, the switch circuit can simply be configured.

Preferably, the first test supply voltage control portion has a first switch electrically coupling the first power supply node to the first voltage in response to a first electrical signal, and the second test supply voltage control portion has a second switch electrically coupling the third power supply node to the first voltage in response to a second electrical signal.

In the semiconductor integrated circuit in accordance with the present invention, since the first and second test supply voltage control circuits are provided with their respective switch circuits and a pin contact test can be performed with the switches turned on and off, the circuit can simply be configured.

In particular, the first switch is a first MOS transistor electrically isolating the first power supply node from the first voltage in response to a first test signal, and the second switch is a second MOS transistor electrically isolating the third power supply node from the first voltage in response to a second test signal.

In the semiconductor integrated circuit in accordance with the present invention, since the switch circuits can be configured with MOS transistors, the switch circuit can simply be configured.

In particular, each of the second and fourth rectifying elements is a field effect transistor formed in a second well which is electrically separated from a substrate using a first well.

In the semiconductor integrated circuit in accordance with the present invention, each of the second and fourth rectifying elements is formed by electrically separating the substrate from the second well using the first well, so that a short circuit between the substrate voltage and the first voltage at the time of a test can be prevented, enabling a proper pin contact test.

In particular, each of the second and fourth rectifying elements is a junction diode element formed of a first conductive semiconductor region and a second conductive semiconductor region provided in a region which is electrically separated from a semiconductor substrate by means of an insulating film formed on the semiconductor substrate.

In the semiconductor integrated circuit in accordance with the present invention, each of the second and fourth rectifying elements is formed with the junction diode formed of the first semiconductor region and the second semiconductor region formed in the region included in the substrate and electrically insulated, so that a simple design can be realized without employing a triple well structure.

In particular, each of the second and fourth rectifying elements is a diode element having a polysilicon layer formed of a P type region and an N type region provided in a region which is electrically insulated from a substrate.

In the semiconductor integrated circuit in accordance with the present invention, each of the second and fourth rectifying elements is formed by a polydiode element provided in a region which is electrically insulated, so that an additional substrate is not required and a simple design can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a table showing the setting conditions and measurement results of the pin contact test in accordance with the first embodiment of the present invention.

FIG. 3 is a table showing the setting conditions and measurement results of the pin contact test in accordance with a modification to the first embodiment.

FIG. 5 is a table showing the setting conditions and measurement results of the pin contact test in accordance with the second embodiment of the present invention.

FIG. 7 is a table showing the setting conditions and measurement results of the pin contact test in accordance with the second embodiment of the present invention.

FIG. 8 shows a vertical structure of an input protection circuit 100 configured with MOS transistors Tr1 and Tr2 equivalent to diodes D1a and D2a.

DESCRIPTION OF THE PREFERRED EMBODIMENTS

Figure 1:
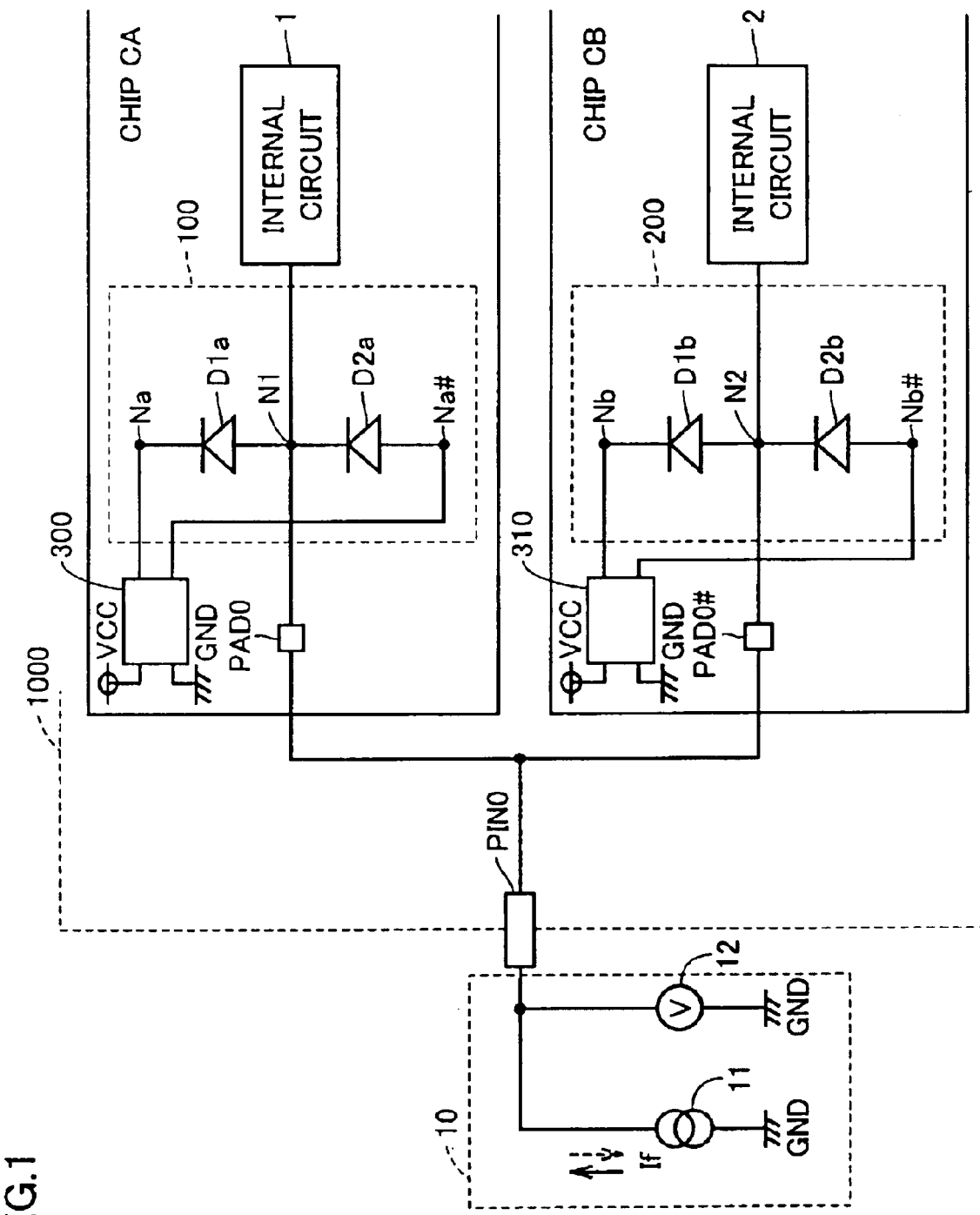
FIG. 1 is a schematic illustration of a semiconductor integrated circuit 1000 which is subjected to a pin contact test, in accordance with a first embodiment of the present invention.

Embodiments of the present invention will be described in detail with reference to the figures. It is noted that the same or corresponding elements will be denoted with the same reference characters in the figures and therefore the description thereof will not be repeated.

(First Embodiment)

Referring to FIG. 1, a semiconductor integrated circuit 1000 includes chips CA and CB and an external pin PIN0. Here, external pin PIN0, which is one of a plurality of external pins provided in semiconductor integrated circuit 1000, is representatively described. Similar pin contact tests can be performed on the other external pins having a configuration similar to external pin PIN0.

Chip CA includes a pad PAD0, an input protection circuit 100, a voltage control circuit 300, and an internal circuit 1. Chip CB includes a pad PAD0#, an input protection circuit 200, a voltage control circuit 310, and an internal circuit 2. At the time of a pin contact test, a measurement circuit 10 is connected to external pin PIN0.

Measurement circuit 10 includes a constant current source 11 and a voltmeter 12 connected in parallel between external pin PIN0 and a ground voltage GND, respectively. A pin contact is tested for any failure by measuring the voltage at external pin PIN0 using voltmeter 12 while a certain constant current If is being supplied from constant current source 11.

External pin PIN0 is connected with both of pads PAD0 and PAD0#. Input protection circuit 100 is arranged between internal circuit 1 and pad PAD0 for protecting internal circuit 1 from an error which may be caused by an input such as static electricity from external pin PIN0. Input protection circuit 100 includes protection diodes D1a and D2a (simply referred to diodes D1a and D2a hereinafter).

Diode D1a has its anode connected to a node N1 and its cathode connected to a power supply node Na. Diode D2a has its cathode connected to node N1 and its anode connected to a power supply node Na#. So-called diode-connected transistors may be applied instead of diodes D1a and D2a. Node N1 is arranged between pad PAD0 and internal circuit 1. Voltage control circuit 300 is connected to a supply voltage VCC and a ground voltage GND for controlling a supply voltage to be applied to power supply nodes Na and Na#.

Input protection circuit 200 has a function similar to input protection circuit 100 and is arranged between internal circuit 2 and pad PAD0# for protecting internal circuit 2 from an error which may be caused by an input such as static electricity from external pin PIN0. Input protection circuit 200 includes protection diodes D1b and D2b (simply referred to diodes D1b and D2b hereinafter). Diode D1b has its anode connected to a node N2 and its cathode connected to a power supply node Nb. Diode D2b has its cathode connected to node N2 and its anode connected to a power supply node Nb#. So-called diode-connected transistors may be applied instead of diodes D1b and D2b. Node N2 is arranged between pad PAD0 and internal circuit 2. Voltage control circuit 310 is connected to a supply voltage VCC and a ground voltage GND for controlling a voltage to be supplied to power supply nodes Nb and Nb#.

In a normal operation mode, power supply nodes Na and Na# in input protection circuit 100 are respectively connected to supply voltage VCC and ground voltage GND through voltage control circuit 300. Power supply nodes Nb and Nb# on chip CB are respectively connected to supply voltage VCC and ground voltage GND through voltage control circuit 310. Diode D1a has a prescribed on-voltage and is rendered conductive when the voltage at external pin PIN0 reaches VCC+Vthpa (Vthpa: the on-voltage of diode D1a) or above. Then, current flows from external pin PIN0 towards power supply node Na, and application of excessive positive voltage on internal circuit 1 is prevented.

Similarly, diode D2a has a prescribed on-voltage and is rendered conductive when the voltage at external pin PIN0 becomes lower than −Vthna (Vthna: the on-voltage of diode D2a). Then, current flows from power supply node Na# toward external pin PIN0, and application of excessive negative voltage on internal circuit 1 is prevented. The foregoing is applicable to input protection circuit 200, wherein the on-voltage of diode D1b is Vthpb and the on-voltage of diode D2b is Vthnb.

A method of a pin contact test in accordance with a first embodiment of the present invention will now be described.

The pin contact test in accordance with the first embodiment of the present invention is aimed to detect a contact failure between chips CA and CB and external pin PIN0 by independently controlling a supply voltage to be applied to power supply nodes Na, Na#, Nb and Nb# by means of voltage control circuits 300 and 310 in a test mode.

FIG. 2 is a table showing the setting conditions and the measurement results of the pin contact test in accordance with the first embodiment of the present invention.

A pin contact test 1 (referred to Test 1 hereinafter) differs from a normal operation mode in that ground voltage GND is replaced by supply voltage VCC as a voltage to be supplied to power supply node Nb# on chip CB, and external pin PIN0 is supplied with constant current If (If<0). Test 1 is aimed to determine a contact failure in chip CB.

Referring to FIG. 2, when there is no contact failure in chip CB, the voltage at external pin PIN0 is decreased by a prescribed amount from supply voltage VCC of power supply node Nb# on chip CB because of conducting diode D2b. For example, when If=−10 μA is supplied, the voltage as measured at external pin PIN0 is 2V. It is noted that in the embodiment of the present invention, supply voltage VCC is assumed as 3V and ground voltage GND as 0V. The voltage drop of the diode is assumed as 1V. Furthermore, when there is a contact failure in chip CB, the voltage at external pin PIN0 is decreased by a prescribed amount from ground voltage GND of power supply node Na# on chip CA because of diode D1b. For example, when If=−10 μA is supplied, the voltage as measured at external pin PIN0 is −1V. In addition, in case of the contact failures in both chips CA and CB, when If=−10 μA is supplied, for example, the voltage as measured at external pin PIN0 is −1V or below, because a current path does not exist due to the contact failures.

Similarly, a pin contact test 2 (referred to Test 2 hereinafter) differs from a normal operation mode in that ground voltage GND is replaced by supply voltage VCC as a voltage to be supplied to power supply node Na# on chip CA, using voltage control circuit 300.

In Test 2, a contact failure can also be detected by a method such as used in pin contact test 1. Test 2 is aimed to determine a contact failure in chip CA.

Referring to FIG. 2, when there is no contact failure in chip CA, the voltage at external pin PIN0 is decreased by a prescribed amount from supply voltage VCC of power supply node Na:# on chip CA because of conducting diode D2a. For example, when If=−10 μA is supplied, the voltage as measured at external pin PIN0 is 2V. On the other hand, when there is a contact failure in chip CA, the voltage at external pin PIN0 is decreased by a prescribed amount from ground voltage GND of power supply node Nb# on chip CB because of conducting diode D2b. When If=−10 μA is supplied, for example, the voltage as measured at external pin PIN0 is −1V. Furthermore, in case of an additional contact failure in chip CB, when −10 μA is supplied, for example, the voltage as measured at external pin PIN0 is −1V or below, because a current path does not exist due to the contact failure.

Therefore, when Test 1 and Test 2 are compared and the measured voltages at external pin PIN0 are 2V in both tests (case A0), for example, it can be determined that both chips CA and CB are free from contact failures. On the other hand, when the measured voltage is −1V in Test 1 and the measured voltage is 2V in Test 2 (case A1), it can be determined that chip CA is normal but chip CB has a contact failure.

Furthermore, when the measured voltage is 2V in Test 1 and the measured voltage is −1V in Test 2 (case A2), it can be determined that chip CA has a contact failure but chip CB is normal. In addition, when the measured voltages are −1V or below in both Tests 1 and 2 (case A3), it can be determined that there are contact failures in both chips CA and CB.

Therefore, such a detecting method enables a separate detection as to whether there is a contact failure for each chip. Furthermore, since an input protection circuit can be used in common with a pin contact test, it is not necessary to use an additional test circuit, resulting in reduction in the number of circuit components.

(Modification to the First Embodiment)

A modification to the first embodiment of the present invention differs from the first embodiment in a voltage to be applied to each of the power supply nodes at the time of a test. Furthermore, external pin PIN0 is supplied with constant current If (If>0).

Referring to FIG. 3, in a pin contact test 3, (referred to Test 3 hereinafter), power supply node Nb on chip CB is connected to ground voltage GND through voltage control circuit 310. Test 3 is aimed to determine a contact failure in chip CB.

When there is no contact failure in chip CB, the voltage at external pin PIN0 is increased by a prescribed amount from ground voltage GND connected to power supply node Nb on chip CB, because of conducting diode D1b. When If=10 μA is supplied, for example, the voltage as measured at external pin PIN0 is −1V.

On the other hand, when there is a contact failure in chip CB, the voltage at external pin PIN0 is increased by a prescribed amount from supply voltage VCC connected to power supply node Na on chip CA, because of conducting diode D1a. When If=10 μA is supplied, for example, the voltage as measured at external pin PIN0 is 4V. Furthermore, in case of the contact failures in both chips CA and CB, when If=10 μA is supplied, for example, the voltage as measured at external pin PIN0 is 4V or above.

Similarly, a pin contact test 4 (referred to Test 4 hereinafter) differs from a normal operation mode in that supply voltage VCC is replaced by ground voltage GND as a voltage to be supplied to power supply node Na on chip CA, and in addition, external pin PIN0 is supplied with constant current If (If>0). In Test 4, a contact failure can be detected through a method similar to Test 3. Test 4 is aimed to determine a contact failure in chip CA.

When there is no contact failure in chip CA, the voltage at external pin PIN0 is increased by a prescribed amount from ground voltage GND connected to power supply node Na on chip CA, because of conducting diode D1a. When If=10 μA is supplied, for example, the voltage as measured at external pin PIN0 is 1V.

On the other hand, when there is a contact failure in chip CA, the voltage at external pin PIN0 is increased by a prescribed amount from supply voltage VCC connected to power supply node Nb on chip CB, because of conducting diode D1b. When If=10 μA is supplied, for example, the voltage as measured at external pin PIN0 is 4V. Furthermore, in case of the contact failures both in chips CA and CB, when If=10 μA is supplied, for example, the voltage as measured at external pin PIN0 is 4V or above.

Therefore, when Test 3 and Test 4 are compared and the measured voltages at external pin PIN0 are 1V in both the tests (case B0), for example, it can be determined that both chips CA and CB are free from contact failures. Furthermore, when the measured voltage is 4V in Test 3 and the measured voltage is 1V in Test 4 (case B1), it can be determined that chip CA is normal and chip CB has a contact failure.

In addition, when the measured voltage is 1V in Test 3 and the measured voltage is 4V in Test 4 (case B2), it can be determined that chip CA has a contact failure and chip CB is normal. When the measured voltages are 4V or above in both Tests 3 and 4 (case B3), it can be determined that there are contact failures in both chips CA and CB.

Therefore, such a detection method enables a separate detection as to whether there is a contact failure for each chip.

(Second Embodiment)

Figure 4:
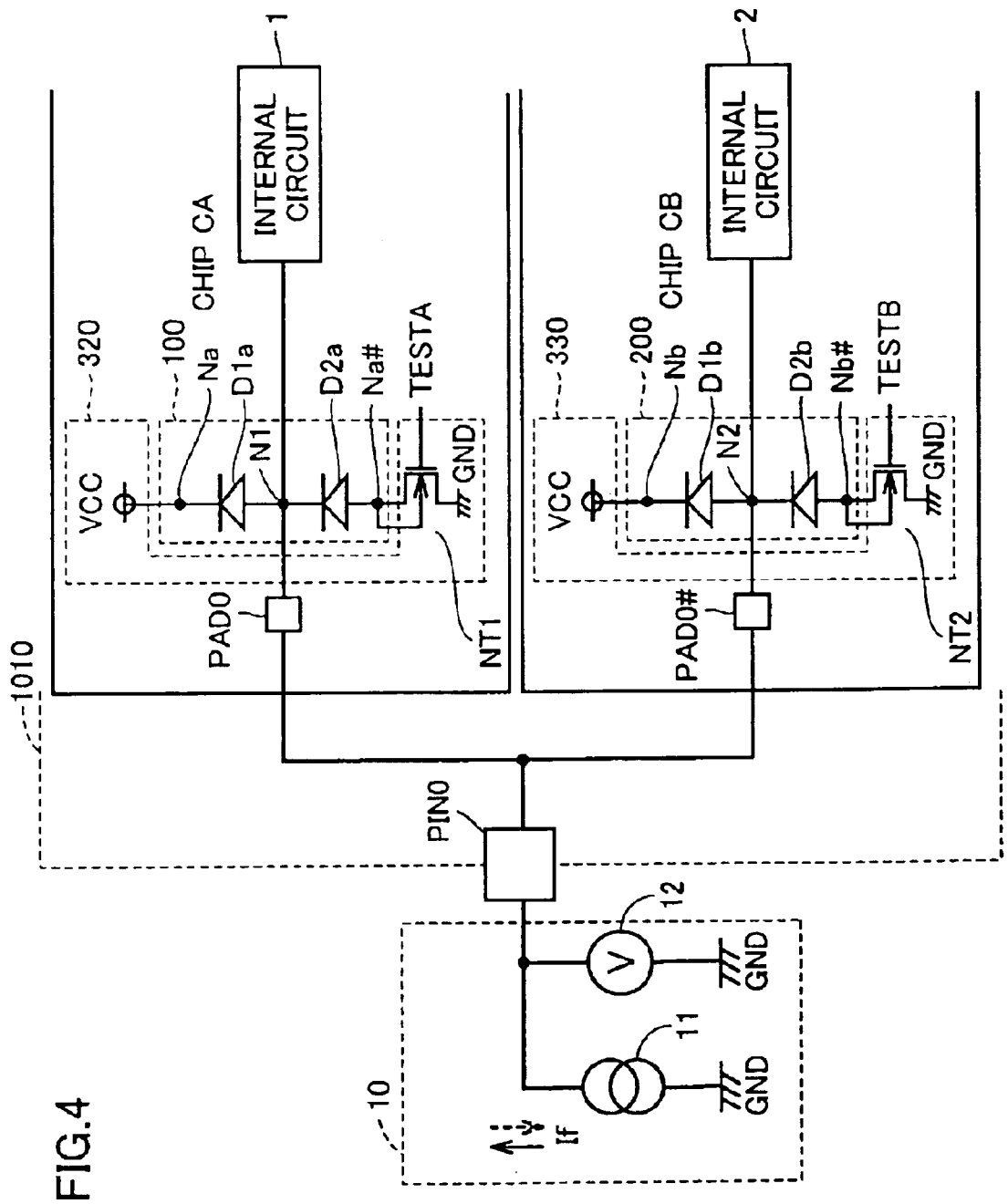
FIG. 4 is a schematic illustration of semiconductor integrated circuit 1010 which is subjected to a pin contact test, in accordance with a second embodiment of the present invention.

Referring to FIG. 4, a second embodiment differs from the first embodiment in that voltage control circuits 300 and 310 are replaced by voltage control circuits 320 and 330.

Voltage control circuit 320 includes a switch NT1. An N channel MOS transistor NT1, for example, is applied to switch NT1. Diode D1a has its anode connected to node N1 and its cathode connected to supply voltage VCC through power supply node Na.

Diode D2a has its anode connected to power supply node Na# and its cathode connected to node N1. Furthermore, N channel MOS transistor NT1 has its drain connected to power supply node Na# and its source connected to ground voltage GND, and receives an input of a test signal TESTA at its gate.

Voltage control circuit 330 includes a switch NT2. An N channel MOS transistor NT2, for example, is applied to switch NT2. Diode D1b has its anode connected to node N2 and its cathode connected to supply voltage VCC through power supply node Nb. Diode D2b has its anode connected to power supply node Nb# and its cathode connected to node N2. Furthermore, N channel MOS transistor NT2 has its drain connected to power supply node Nb# and its source connected to ground voltage GND, and receives an input of a test signal TESTB at its gate.

A pin contact test in accordance with the second embodiment of the present invention will be described.

Referring to FIG. 5, in a normal operation mode, both test signals TESTA and TESTB are set at "H" (high) level (here 3V, same in the following). Therefore, transistors NT1 and NT2 are rendered conductive, and both power supply nodes Na# and Nb# are electrically coupled with ground voltage GND.

A pin contact test 5 (referred to Test 5 hereinafter) differs from a normal operation mode in that test signal TESTA is set from "H" level to "L" (low) level. This causes power supply node Na# to be opened. In addition, external pin PIN0 is supplied with constant current If (If<0), and then contact failure in chip CB is determined.

Referring to FIG. 5, when there is no contact failure in chip CB, the voltage at external pin PIN0 is decreased by a prescribed amount from ground voltage GND of power supply node Nb# on chip CB, because of conducting diode D2b. When If=−10 µA is supplied, for example, the voltage as measured at external pin PIN0 is −1V. On the other hand, when there is a contact failure in chip CB, the voltage at external pin PIN0 is decreased by a prescribed amount from ground voltage GND due to an open state of power supply node Na#. When If=−10 µA is supplied, for example, the voltage as measured at external pin PIN0 is −1V or below.

Similarly, a pin contact test 6, (referred to Test 6 hereinafter) differs from a normal operation mode in that test signal TESTB is set from "H" level to "L" level. This causes power supply node Nb# to be opened. In addition, external pin PIN0 is supplied with constant current If (<0), and then a contact failure in chip CA is determined.

Referring to FIG. 5, when there is no contact failure in chip CA, the voltage at external pin PING is decreased by a prescribed amount from ground voltage GND of power supply node Na# on chip CA, because of conducting diode D2a. When If=−10 µA is supplied, for example, the voltage as measured at external pin PING is −1V.

On the other hand, when there is a contact failure in chip CA, the voltage at external pin PIN0 is decreased by a prescribed amount from the ground voltage due to an open state of transistor NT2 on chip CB. When If =−10 µA is supplied, for example, the voltage as measured at external pin PING is −1V or below.

Therefore, when Tests 5 and 6 are compared and the measured voltages at external pin PIN0 are −1V in both the tests (case C0), it can be determined that both chips CA and CB are free from contact failures. Furthermore, the measured voltage is −1V or below in Test 5, and the measured voltage is −1V in Test 6 (case C1), it can be determined that chip CA is normal but chip CB has a contact failure.

In addition, when the measured voltage is −1V in Test 5 and the measured voltage is −1V or below in Test 6 (case C2), it can be determined that chip CA has a contact failure and chip CB is normal. Additionally, the measured voltages are −1V or below in both Tests 6 and 7 (case C3), it can be determined that there are contact failures in both chips CA and CB.

Therefore, such a detection method enables a separate detection as to whether there is a contact failure.

Furthermore, with such a configuration, the power supply node can be easily controlled in comparison with the first embodiment, resulting in a further reduction in the number of circuit components.

Modification to the Second Embodiment

Figure 6:
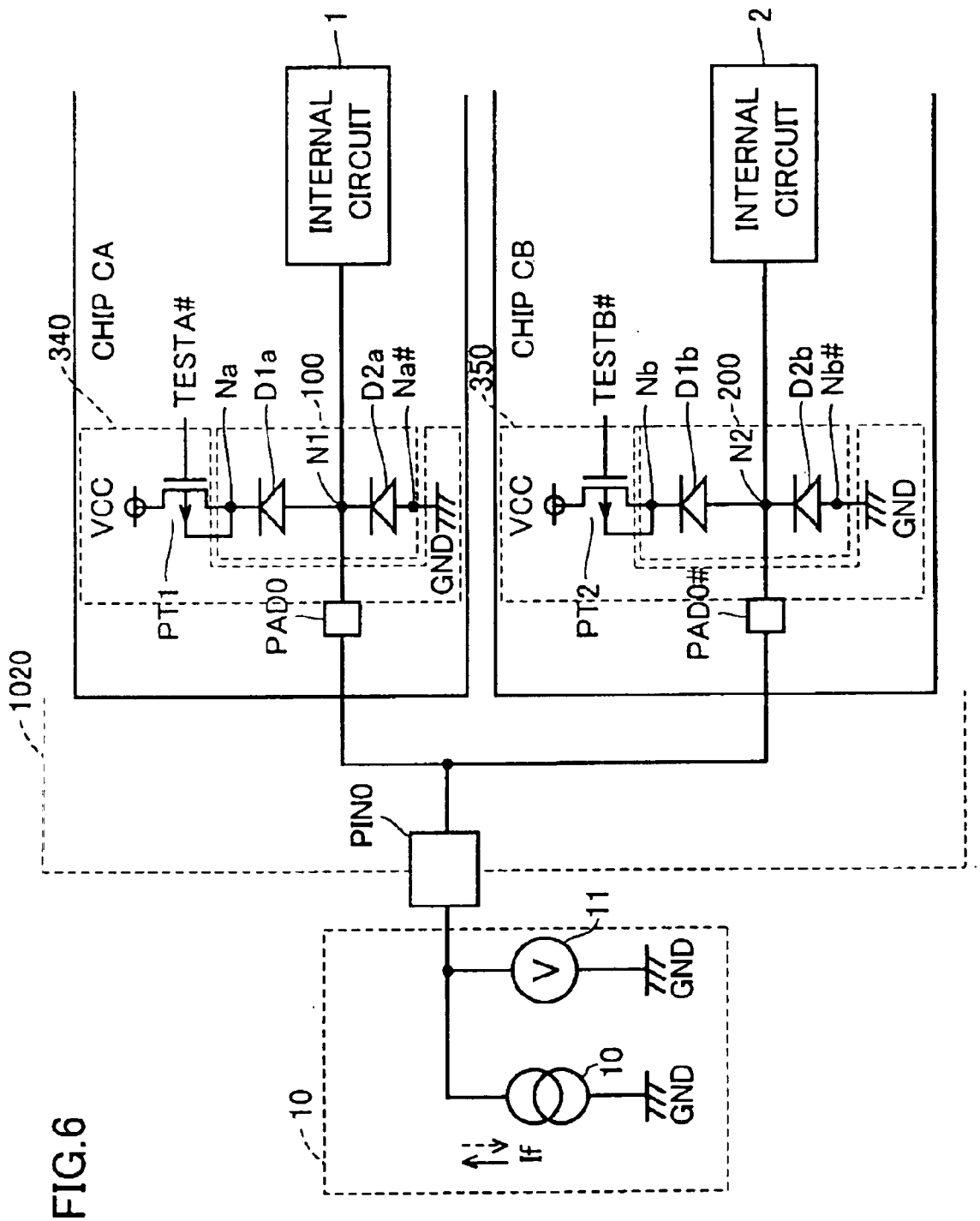
FIG. 6 is a schematic illustration of a semiconductor integrated circuit 1020 which is subjected to a pin contact test, in accordance with a modification to the second embodiment of the present invention.

Referring to FIG. 6, a modification to the second embodiment of the present invention differs from the second embodiment in the power supply node to be opened in the pin contact test. Specifically, voltage control circuits 320 and 330 are replaced by voltage control circuits 340 and 350.

Voltage control circuit 340 includes a switch PT1 and employs, for example, a P Channel MOS transistor PT1.

Diode D1a has its anode connected to node N1 and its cathode connected to power supply node Na. Furthermore, P Channel MOS transistor PT1 has its drain connected to power supply node Na and its source connected to supply voltage VCC and receives an input of a test signal TESTA# at its gate. Diode D2a has its anode connected to ground voltage GND through power supply node Na# and its cathode connected to node N1.

Voltage control circuit 350 includes a switch PT2 and employs, for example, a P Channel MOS transistor PT2.

Diode D1b has its anode connected to node N2 and its cathode connected to power supply node Nb. Furthermore, P Channel MOS transistor PT2 has its drain connected to power supply node Nb and its source connected to supply voltage VCC and receives an input of a test signal TESTB# at its gate. Diode D2b has its anode connected to ground voltage GND through power supply node Nb# and its cathode connected to node N2.

A pin contact test in accordance with the second embodiment of the present invention will now be described.

Referring to FIG. 7, in a normal operation mode, both test signals TESTA# and TESTB# are set at "L" level. Therefore, transistors PT1 and PT2 are rendered conductive, and both power supply nodes Na and Nb are electrically coupled to supply voltage VCC.

A pin contact test 7 (referred to Test 7 hereinafter) differs from a normal operation mode in that test signal TESTA# is set from "L" level to "H" level. This causes power supply node Na to be opened. Furthermore, external pin PIN0 is supplied with constant current If (>0) and then a contact failure in chip CB is determined.

When there is no contact failure in chip CB, the voltage at external pin PIN0 is increased by a prescribed amount from supply voltage VCC of power supply node Nb on chip CB, because of conducting diode D1b. When If=10 µA is supplied, for example, the voltage as measured at external pin PIN0 is 4V.

On the other hand, in case of the contact failure in chip CB, when If=10 µA is supplied, for example, the voltage as measured at external pin PIN0 is 4V or above due to an open state of power supply node Na.

Similarly, a pin contact test 8 (referred to Test 8 hereinafter) differs from a normal operation mode in that test signal TESTB# is set from "L" level to "H" level. This causes power supply node Nb to be opened. Furthermore, external pin PIN0 is supplied with constant current If (>0), and then a contact failure in chip CA is determined.

When there is no contact failure in chip CA, the voltage at external pin PIN0 is increased by a prescribed amount from supply voltage VCC of power supply node Na on chip CA, because of conducting diode D1a. When If=10 µA is supplied, for example, the voltage as measured at external pin PIN0 is 4V.

On the other hand, in case of a contact failure in chip CA, when If=10 µA is supplied, for example, the voltage as measured at external pin PIN0 is 4V or above due to an open state of transistor PT2 on chip CB.

Therefore, when Tests 7 and 8 are compared and the measured voltages at external pin PIN0 are 4V in both the tests (case D0), it can be determined that both chips CA and CB are free from contact failures. Furthermore, when the measured voltage is 4V or above in Test 7 and the measured voltage is 4V in Test 8 (case D1), it can be determined that chip CA is normal and chip CB has a contact failure. In addition, when the measured voltage is 4V in Test 7 and the measured voltage is 4V or above in Test 8 (case D2), it can be determined that chip CA has a contact failure and chip CB is normal. Additionally, when the measured voltages are 4V or above in both Tests 7 and 8 (case D3), it can be determined that there are contact failures in both chips CA and CB.

Therefore, such a detection method enables a separate detection as to whether there is a contact failure.

(Third Embodiment)

In the first and second embodiments above of the present invention, such a method has been described in that a contact failure is detected based on measurement results obtained by measuring the voltages at external pin PIN0 with varying power supply to be applied to each power supply node according to each of the contact tests. Since each power supply node needs to be provided with a power supply different from that of a normal operation, however, the diode in the first embodiment, in particular, needs to be specially designed.

In the following, a design of the diode used in the first embodiment will be described.

Figure 8:
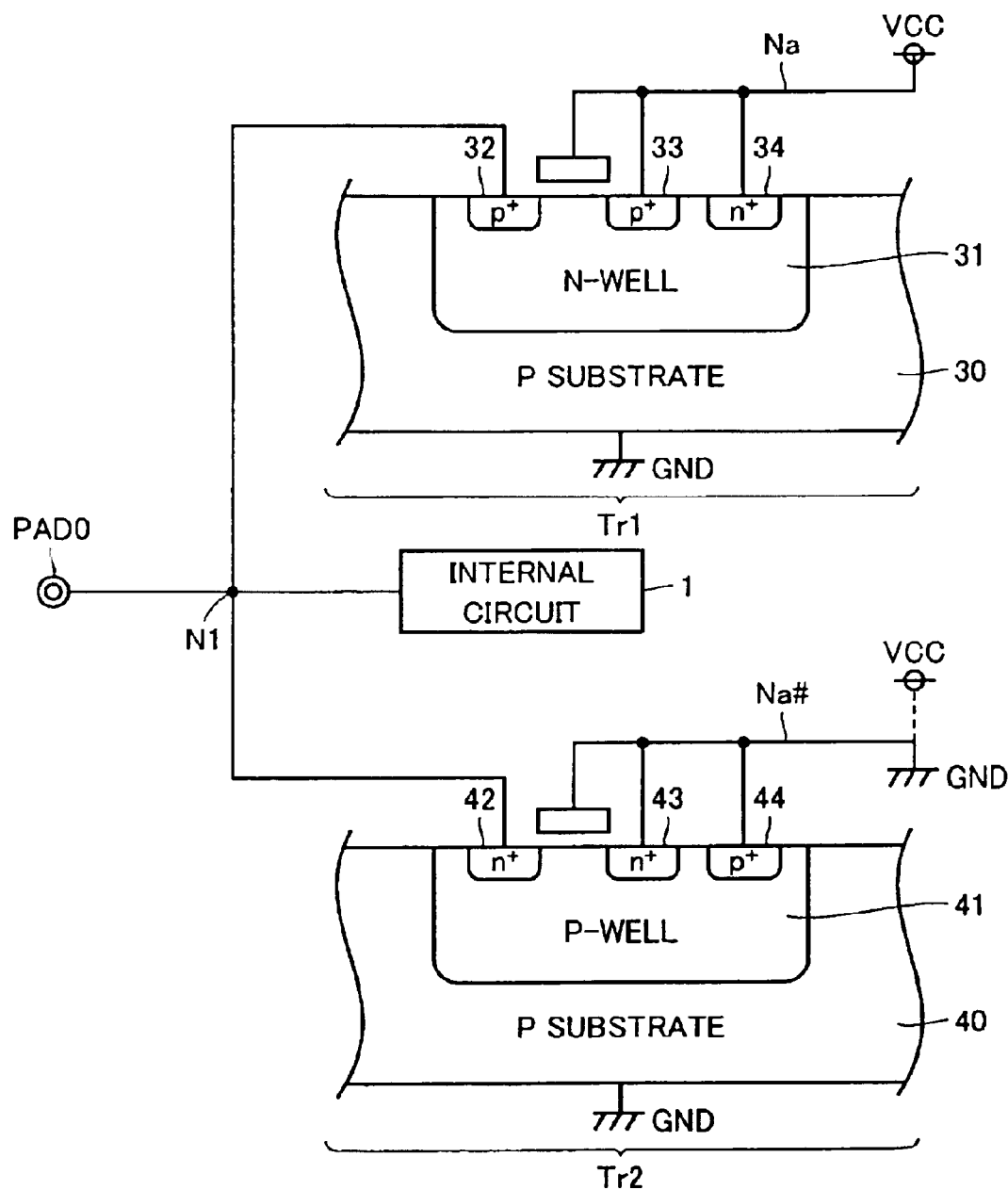

Referring to FIG. 8, a transistor Tr1 has an N-well 31 formed on a P substrate 30 which is connected to a ground voltage GND. P type regions 32 and 33 and an N type region 34 are formed in N-well 31. P type region 32 is connected to node N1, and P type region 33 and N type region 34 are connected to a power supply node Na which is connected to a supply voltage VCC.

A transistor Tr2 has a P-well 41 formed on a P substrate 40 which is connected to a ground voltage GND. N type regions 42 and 43 and a P type region 44 are formed in P-well 41. N type region 42 is connected to node N1, and N type region 43 and P type region 44 are connected to a power supply node Na# which is connected to the ground voltage GND.

According to the first embodiment of the present invention, in input protection circuit 100, power supply node Na# is connected to ground voltage GND in a normal operation and instead is connected to supply voltage VCC in Test 2. With such a configuration of transistor Tr2 as shown in FIG. 8, power supply node Na# cannot be connected to supply voltage VCC.

The reason is that when power supply node Na# is connected to supply voltage VCC, P substrate 40 fixed to ground voltage GND and P type region 44 connected to supply voltage VCC are electrically short-circuited, resulting in a short circuit between supply voltage VCC and ground voltage GND.

Then, the third embodiment of the present invention is aimed to provide a MOS transistor for preventing the occurrence of such a short circuit.

Figure 9:
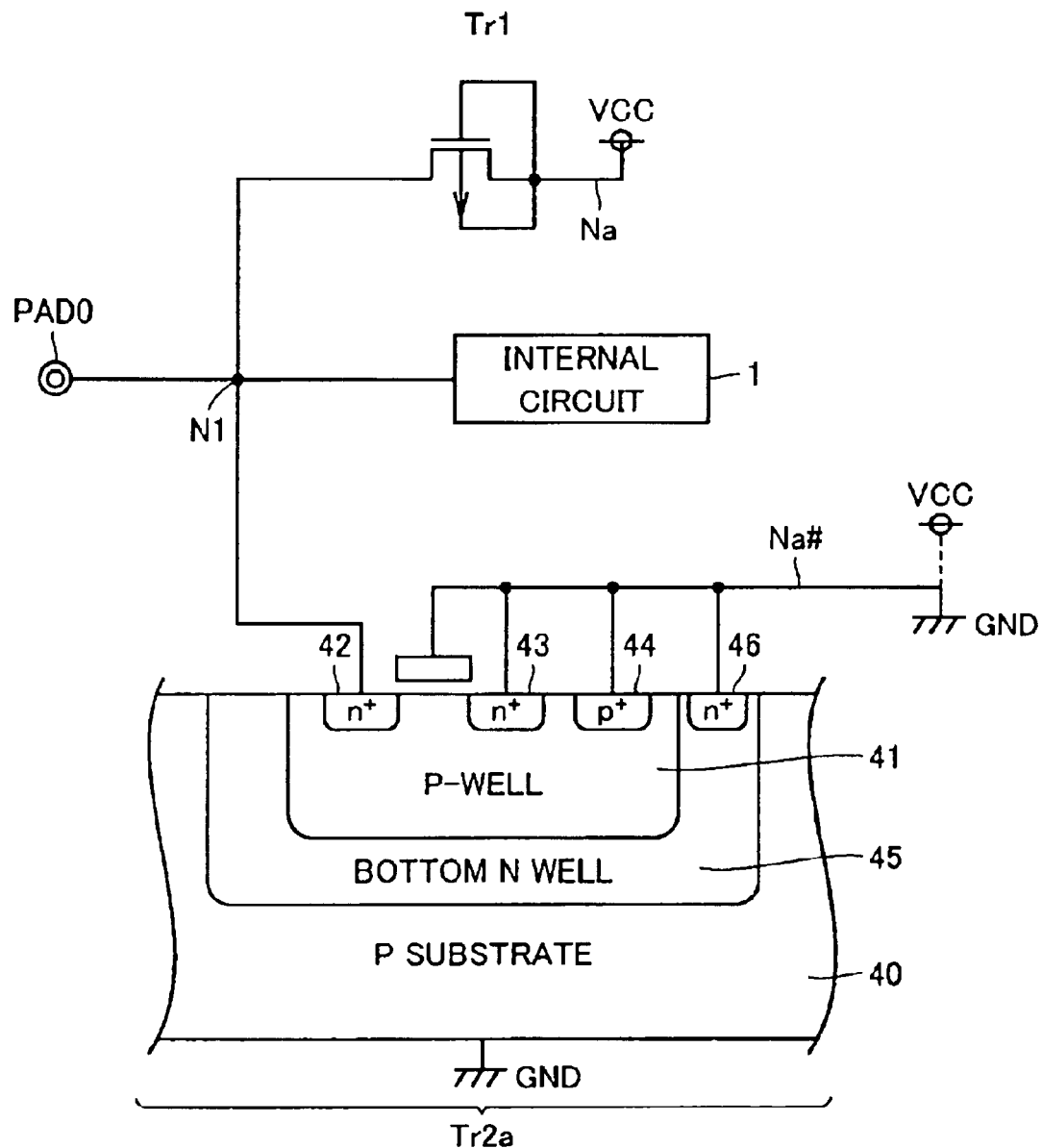
FIG. 9 shows a vertical structure of MOS transistor Tr2a in accordance with a third embodiment of the present invention.

Referring to FIG. 9, an MOS transistor Tr2a differs from MOS transistor Tr2 in that a bottom N-well 45 is newly added to form a triple well structure. Specifically, on P substrate 40, bottom N-well 45 is provided, on which P-well 41 is formed. An N type region 46 formed in bottom N-well 45 is connected with power supply node Na#.

P-well 41 is separated from P substrate 40 by bottom N-well 45 and bottom N-well 45 and P-well 41 have the same potential, so that supply voltage VCC and ground voltage GND will not be short-circuited even when power supply node Na# is connected with supply voltage VCC.

With such a configuration, the pin contact test illustrated in the first embodiment can properly be performed.

(First Modification to the Third Embodiment)

The short circuit between supply voltage VCC and ground voltage GND as described in the third embodiment is caused because formation of the MOS transistor on the substrate imposes a limit on the well potential.

Therefore, a first modification to the third embodiment of the present invention is aimed to form a diode for input protection circuit 100 using a discrete element separated from the substrate.

Figure 10:
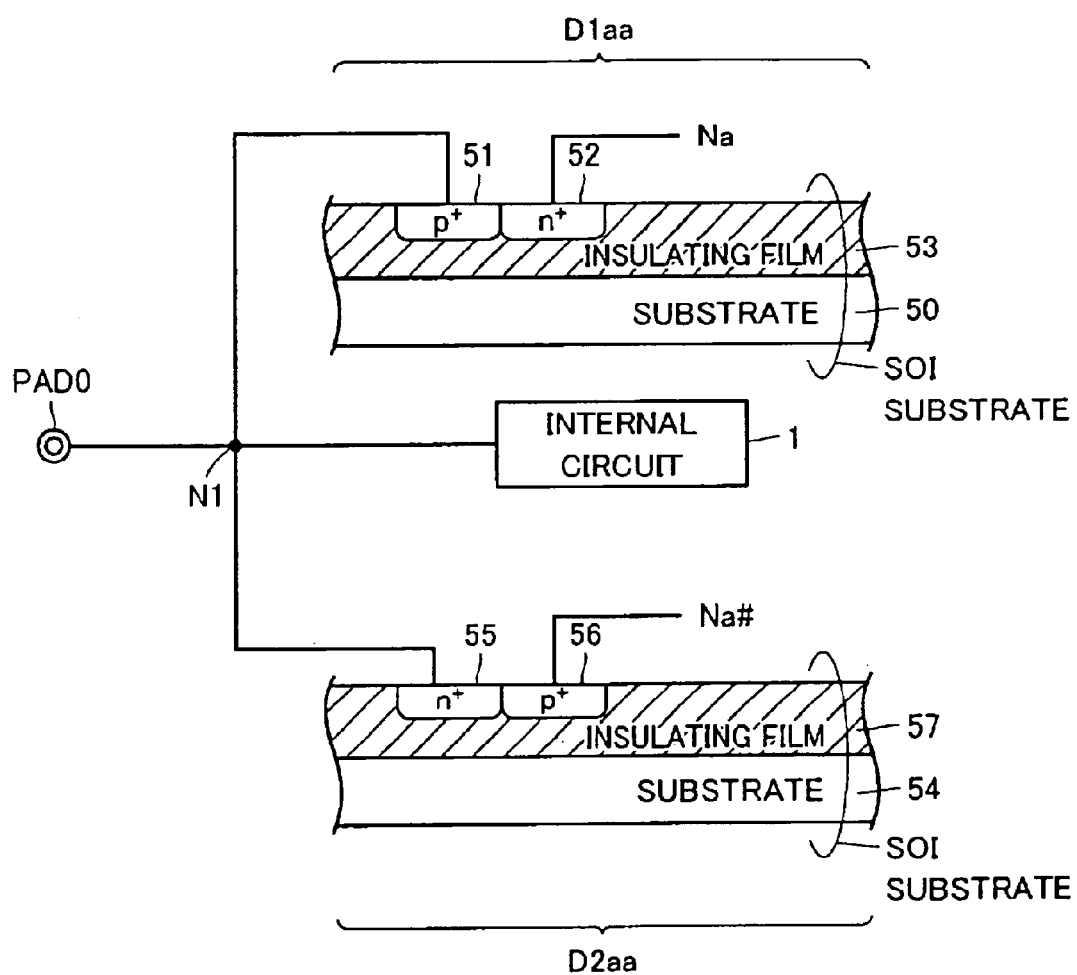
FIG. 10 shows a vertical structure of diodes D1aa and D2aa formed on an SOI substrate.

Referring to FIG. 10, diode D1aa has a P type region 51 and an N type region 52 formed in an insulating film 53 on a substrate 50 included in an SOI substrate. Furthermore, diode D2aa has an N type region 55 and a P type region 56 formed in an insulating film 57 on a substrate 54 included in an SOI substrate.

With the present configuration, diodes D1aa and D2aa are formed on the SOI substrate as discrete elements, so that the short circuit between supply voltage VCC and ground voltage GND can be prevented without employing a triple well structure.

With such a configuration, a pin contact test shown in the first embodiment can also be performed properly.

(Second Modification to the Third Embodiment)

A vertical structure of a diode D1a# will be described.

Figure 11:
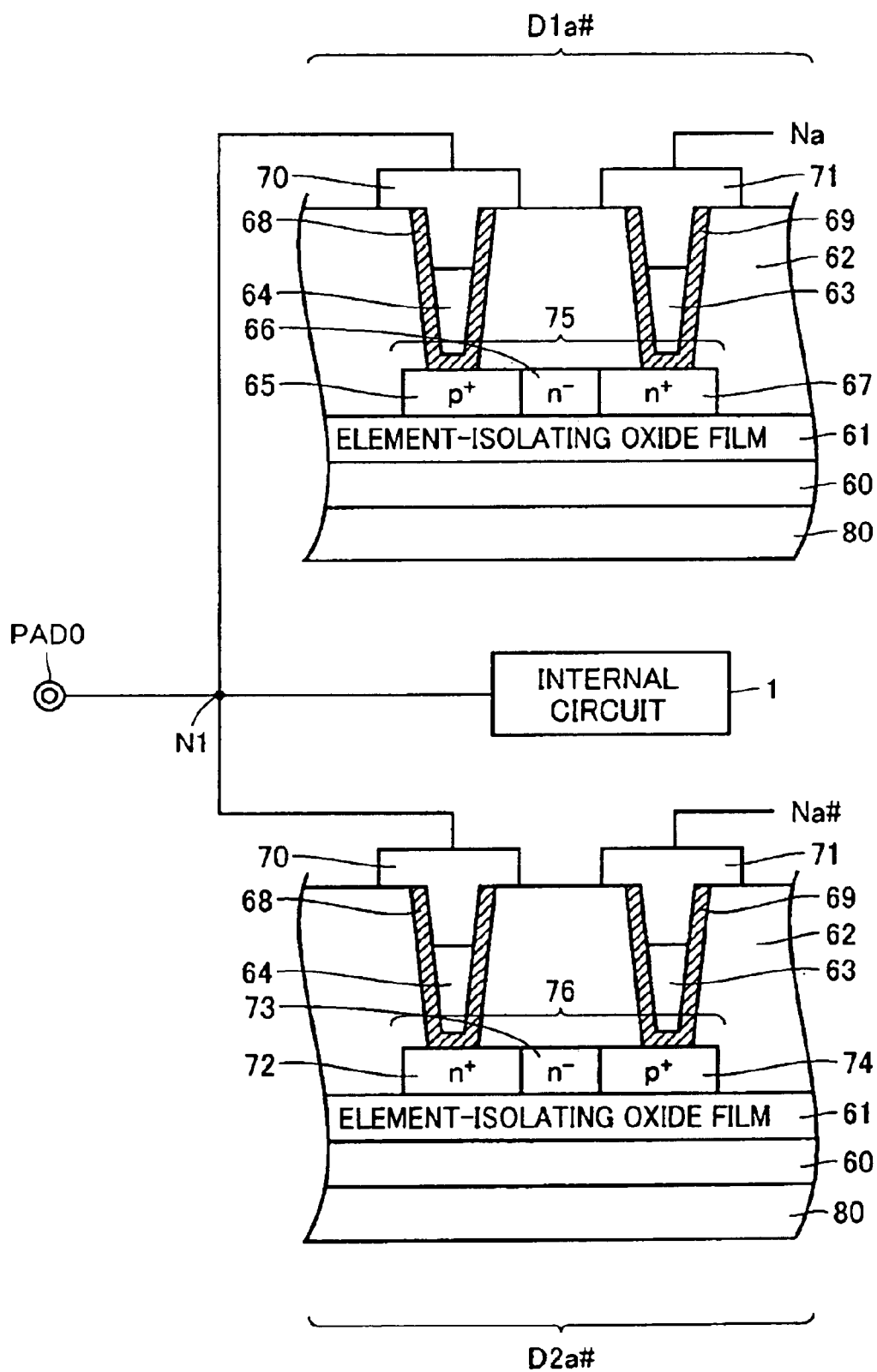
FIG. 11 shows a vertical structure of diodes D1a# and D2a# which can be replaced by diodes D1aa and D2aa in FIG. 10.
Figure 12:
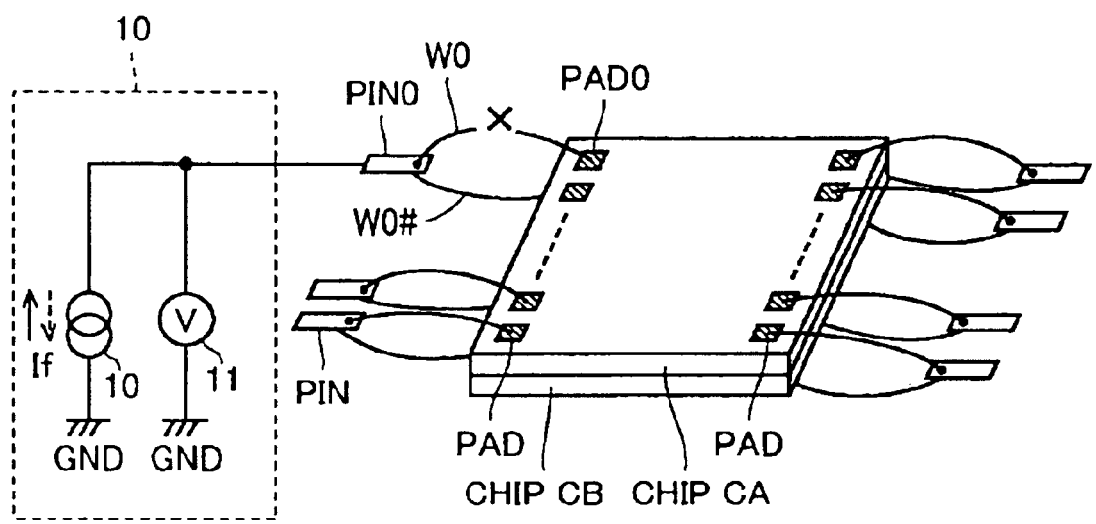
FIG. 12 is a schematic illustration of a multi chip package.

Referring to FIG. 11, a polydiode element 60 used as diode D1a# includes an element-isolating oxide film 61 provided on the main surface of a semiconductor substrate 80. On element-isolating oxide film 61, PN junction polysilicon layer 75 is provided which has a P type region 65, an N type region 66 adjacent to P type region 65, and an N type region 67 in concentrations higher than the adjacent N type region 66. On element-isolating oxide film 61, an inter layer insulating film 62 is provided to cover PN junction polysilicon layer 75.

In a contact hole which exposes P type region 65 in inter layer insulating film 62, a barrier metal 68 connected with P type region 65 and a tungsten plug 64 inside thereof are provided. Furthermore, in a contact hole exposing N type region 67, a barrier metal 69 connected to N type region 67 and a tungsten plug 63 inside thereof are provided. An interconnection layer 70 is electrically coupled to the P type region with barrier metal 68 and tungsten plug 64 interposed. An interconnection layer 71 is electrically coupled to the N type region with barrier metal 69 and tungsten plug 63 interposed.

A diode D2a# differs from diode D1a# in that PN junction polysilicon layer 75 is replaced by a PN junction polysilicon layer 76. PN junction polysilicon layer 76 has an N type region 72, an N type region 73 in concentrations higher than the adjacent N type region 72, and a P type region 74 adjacent to N type region 73.

In this way, a diode is formed as a discrete element by a polydiode, so that a triple well structure requiring a complicated processes as well as an SOI substrate become unnecessary. Therefore, the pin contact test shown in the first embodiment can properly be performed without any complicated steps of forming the components in the input protection circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
a first chip including a first input pad capable of communicating an electrical signal and a second chip including a second input pad capable of communicating an electrical signal;
said first chip including
a first power supply node for receiving a supply of a first voltage in a normal operation,
a second power supply node for receiving a supply of a second voltage which is lower than said first voltage in said normal operation,
a first protection circuit forming a current path between said first input pad and said first power supply node when the voltage of said first input pad is higher than that of said first power supply node by at least a prescribed amount while forming a current path between said first input pad and said second power supply node when the voltage of said first input pad is lower than that of said second power supply node by at least a prescribed amount, and
a first test supply voltage control portion for setting the voltages of said first and second power supply nodes at the time of a test,
said second chip including
a third power supply node for receiving a supply of said first voltage in said normal operation,
a fourth power supply node for receiving a supply of said second voltage in said normal operation,
a second protection circuit forming a current path between said second input pad and said third power supply node when the voltage of said second input pad is higher than that of said third power supply node by at least a prescribed amount while forming a current path between said second input pad and said fourth power supply node when the voltage of said second input pad is lower than that of said fourth power supply node by at least a prescribed amount, and
a second test supply voltage control portion for setting the voltages of said third and fourth power supply nodes at the time of said test; said semiconductor integrated circuit further comprising
an external pin terminal for an electrical contact with said first and second input pads,
said external pin terminal receiving an input of a prescribed current for testing said contact with said first and second input pads at the time of said test.

2. The semiconductor integrated circuit according to claim 1, wherein
said first protection circuit includes
a first rectifying element electrically coupled between said first input pad and said first power supply node in a forward direction from said first input pad toward said first power supply node, and
a second rectifying element electrically coupled between said first input pad and said second power supply node in a forward direction from said second power supply node toward said first input pad, and
said second protection circuit includes
a third rectifying element electrically coupled between said second input pad and said third power supply node in a forward direction from said second input pad toward said third power supply node, and
a fourth rectifying element electrically coupled between said second input pad and said fourth power supply node in a forward direction from said second power supply node toward said second input pad.

3. The semiconductor integrated circuit according to claim 1, wherein
said test includes a first subtest and a second subtest,
in said first subtest, said first test supply voltage control portion supplies said first voltage to each of said first and second power supply nodes, and said second test supply voltage control portion supplies said first and second voltages to said third and fourth power supply nodes, respectively, and
in said second subtest, said first test supply voltage control portion supplies said first and second voltages to said first and second power supply nodes, respectively, and said second test supply voltage control portion supplies said first voltage to each of said third and fourth power supply nodes.

4. The semiconductor integrated circuit according to claim 1, wherein
said test includes a first subtest and a second subtest,
in said first subtest, said first test supply voltage control portion supplies said second voltage to each of said first and second power supply nodes, and said second test supply voltage control portion supplies said first and second voltages to said third and fourth power supply nodes, respectively, and
in said second subtest, said first test supply voltage control portion supplies said first and second voltages to said first and second power supply nodes, respectively, and said second test supply voltage control portion supplies said second voltage to each of said third and fourth power supply nodes.

5. The semiconductor integrated circuit according to claim 1, wherein
said first test supply voltage control portion includes a first switch electrically coupling said second power supply node to said second voltage in response to a first electrical signal, and
said second test supply voltage control portion includes a second switch electrically coupling said fourth power supply node to said second voltage in response to a second electrical signal.

6. The semiconductor integrated circuit according to claim 5, wherein
said first switch is a first MOS transistor electrically isolating said second power supply node from said second voltage in response to a first test signal, and
said second switch is a second MOS transistor electrically isolating said fourth power supply node from said second voltage in response to a second test signal.

7. The semiconductor integrated circuit according to claim 1, wherein
said first test supply voltage control portion has a first switch electrically coupling said first power supply node to said first voltage in response to a first electrical signal, and
said second test supply voltage control portion has a second switch electrically coupling said third power supply node to said first voltage in response to a second electrical signal.

8. The semiconductor integrated circuit according to claim 7, wherein
said first switch is a first MOS transistor electrically isolating said first power supply node from said first voltage in response to a first test signal, and said second switch is a second MOS transistor electrically isolating said third power supply node from said first voltage in response to a second test signal.

9. The semiconductor integrated circuit according to claim 2, wherein
each of said second and fourth rectifying elements is a field effect transistor formed in a first well which is electrically separated from a substrate using a second well.

10. The semiconductor integrated circuit according to claim 2, wherein
each of said second and fourth rectifying elements is a junction diode element formed of a first conductive semiconductor region and a second conductive semiconductor region provided in a region which is electrically separated from a semiconductor substrate by an insulating film formed on said semiconductor substrate.

11. The semiconductor integrated circuit according to claim 2, wherein
each of said second and fourth rectifying elements is a diode element having a polysilicon layer formed of a P type region and an N type region, provided in a region which is electrically insulated from a substrate.

12. A semiconductor integrated circuit, comprising:
a first chip including a first input pad capable of communicating an electrical signal and a second chip including a second input pad capable of communicating an electrical signal;
said first chip including
a first power supply node receiving a supply of a first voltage in a normal operation,
a second power supply node receiving a supply of a second voltage which is lower than said first voltage in said normal operation,
a first protection circuit forming a current path between said first input pad and said first power supply node when the voltage of said first input pad is higher than that of said first power supply node by at least a prescribed amount while forming a current path between said first input pad and said second power supply node when the voltage of said first input pad is lower than that of said second power supply node by at least a prescribed amount, and
a first test supply voltage control portion be capable of electrically cutting off the current path between said first input pad and one of said first and second power supply nodes at the time of a test,
said second chip including
a third power supply node receiving a supply of said first voltage in said normal operation,
a fourth power supply node receiving a supply of said second voltage in said normal operation,
a second protection circuit forming a current path between said second input pad and said third power supply node when the voltage of said second input pad is higher than that of said third power supply node by at least a prescribed amount while forming a current path between said second input pad and said fourth power supply node when the voltage of said second input pad is lower than that of said fourth power supply node by at least a prescribed amount, and
a second test supply voltage control portion capable of electrically cutting off the current path between said second input pad and one of said third and fourth power supply nodes at the time of said test; said semiconductor integrated circuit further comprising a common external pin terminal for an electrical contact with said first and second input pads,
one of said first and second test supply voltage control portion is in a state of electrically cutting off the current path and the other of said first and second test supply voltage control portion is in the state forming the current path at the time of said test.

13. The semiconductor integrated circuit according to claim 12, wherein
said first protection circuit includes
a first rectifying element electrically coupled between said first input pad and said first power supply node in a forward direction from said first input pad toward said first power supply node, and
a second rectifying element electrically coupled between said first input pad and said second power supply node in a forward direction from said second power supply node toward said first input pad, and
said second protection circuit includes
a third rectifying element electrically coupled between said second input pad and said third power supply node in a forward direction from said second input pad toward said third power supply node, and
a fourth rectifying element electrically coupled between said second input pad and said fourth power supply node in a forward direction from said second power supply node toward said second input pad.

14. The semiconductor integrated circuit according to claim 13, wherein
each of said second and fourth rectifying elements is a field effect transistor formed in a first-conductivity type well,
said first conductive well is formed in a second-conductivity type well, and
said second conductive well is formed in a first-conductivity type semiconductor substrate.

15. The semiconductor integrated circuit according to claim 13, wherein
each of said second and fourth rectifying elements is a junction diode element formed of a first conductive semiconductor region and a second conductive semiconductor region provided in a region which is electrically separated from a semiconductor substrate by an insulating film formed on said semiconductor substrate.

16. The semiconductor integrated circuit according to claim 13, wherein
each of said second and fourth rectifying elements is a diode element having a polysilicon layer formed of a P type region and an N type region provided in a region which is electrically insulated from a substrate.

17. The semiconductor integrated circuit according to claim 1, wherein
said first protection circuit includes
a first rectifying element electrically coupled between said first input pad and said first power supply node in a forward direction from said first input pad toward said first power supply node, and
a second rectifying element electrically coupled between said first input pad and said second power supply node in a forward direction from said second power supply node toward said first input pad.

18. The semiconductor integrated circuit according to claim 1, wherein
said test includes a first subtest, in said first subtest, said first test supply voltage control portion supplies said first voltage to each of said first and second power supply nodes, and said second test supply voltage control portion supplies said first and second voltages to said third and fourth power supply nodes, respectively.

19. The semiconductor integrated circuit according to claim 1, wherein
said first test supply voltage control portion includes a first switch electrically coupling said second power supply node to said second voltage in response to a first electrical signal.

20. The semiconductor integrated circuit according to claim 1, wherein
said first test supply voltage control portion has a first switch electrically coupling said first power supply node to said first voltage in response to a first electrical signal.

* * * * *